(12) United States Patent
To

(10) Patent No.: US 7,183,670 B2
(45) Date of Patent: Feb. 27, 2007

(54) POWER SUPPLY FOR ELECTRONIC SWITCH

(75) Inventor: Wai Hung To, Hong Kong (HK)

(73) Assignee: ME Electronic Products Limited, Hong Kong (HK)

( * ) Notice: Subject to any disclaimer, the term of this patent is extended or adjusted under 35 U.S.C. 154(b) by 412 days.

(21) Appl. No.: 10/767,804

(22) Filed: Jan. 29, 2004

(65) Prior Publication Data

US 2005/0168074 A1 Aug. 4, 2005

(51) Int. Cl.
*H01H 35/00* (2006.01)
(52) U.S. Cl. ..................................... 307/126
(58) Field of Classification Search ................. 307/126
See application file for complete search history.

(56) References Cited

U.S. PATENT DOCUMENTS 5,140,255 A * 8/1992 Tardio et al. ............... 323/322

6,380,692 B1 * 4/2002 Newman et al. ............ 315/194

* cited by examiner

*Primary Examiner*—Robert L. Deberadinis
(74) *Attorney, Agent, or Firm*—Alix, Yale & Ristas, LLP

(57) ABSTRACT

A remote power switch uses the initial portion of each AC positive and negative going current pulse to generate power for the controller. This is accomplished by removing the gate signal from an electronic power delivery component at each zero cross and restoring the gate signal after sufficient power has been stored to power the controller for the remainder of each AC current pulse. The majority of each current pulse is delivered through the electronic power delivery component to the load. One embodiment employs a transistor oscillator with transformer feed back to produce a self-regulating power supply. An aspect of the present invention relates to color-coding of a switch cover of the remote power switch to match the color of the corresponding actuation key on the remote controller.

14 Claims, 4 Drawing Sheets

POWER SUPPLY FOR ELECTRONIC SWITCH

BACKGROUND OF THE INVENTION

1. Field of the Invention

The invention relates generally to power supplies and more particularly to a power supply employing a pulse-generating circuit magnetically coupled to a power supply to provide operating voltage for a remote power switch.

2. Description of the Related Art

Electrically actuated "remote" switches are used to replace mechanical switches in a wide variety of applications. In a recent trend, remote switches are being employed to replace conventional mechanically actuated switches for computer and communications equipment as well as ordinary wall switches in the home. A remote power switch permits service personnel to remotely power down and re-boot computers, servers and the like to remove possible causes of malfunction. Remotely actuated wall switches permit automated control over lighting and home appliances. Further, remotely actuated wall switches allow the user to adjust appliances using a remote control.

Remote power switches require a source of electrical energy to operate. Some remote power switches employ batteries and may include a charging device to maintain a power source for the switch. Batteries tend to be expensive, bulky, environmentally unfriendly and maintenance intensive. Other prior art remote power switches use simple rectifying circuits to tap facility power to provide the necessary operating voltage. Simple, passive circuits connected to facility power suffer from several disadvantages. First, they tend to be inefficient, employing resistance and/or other inactive components that are constantly dissipating facility power and radiate heat into the enclosure occupying the remote power switch. In addition, simple continuously connected power supply circuits do not isolate the control device from facility power. Surges or spikes in facility power may damage the control device. The control device may include a microcontroller or other integrated circuit operating at a radio frequency (RF) and may feed back an interfering signal to the facility power through such simple power supply circuits.

SUMMARY OF THE INVENTION

A remote power switch in accordance with the present invention employs a transistor oscillator circuit to divide facility alternating current into pulses of electrical energy. A transformer magnetically couples the pulses to a power supply that rectifies, filters and stabilizes the resulting electrical energy to provide a stable DC power source for the remote power switch. The pulse-generating circuit employs feedback from the transformer to control switching of the transistor.

The inventive remote power switch design employs a transistor to tap a small amount of facility power for use by the control device of the remote power switch. When the transistor is off, it does not dissipate any facility power and, therefore, does not radiate heat. The pulse-generating circuit may be tuned to deliver only the power required by the control device. The efficiency of the remote power switch is dramatically improved according to this aspect of the present invention.

Efficiency of a remote power switch is significant as more and more conventional switches are replaced with remote power switches. If each remote power switch continuously taps a small amount of facility power, the cumulative power usage can be significant. Therefore, an object of the present invention is to provide a remote power switch whose continuous power drain is as small as possible. Another reason for reducing the power drain of each remote power switch is that excess power is radiated in the form of heat. Remote power switches are generally installed in enclosed spaces where radiated heat is difficult to disperse. Overheating within the enclosure of the remote power switch may damage the components of the remote power switch or adjacent electronic circuits.

Magnetically coupling the pulse-generating circuit to the power supply effectively electrically isolates the control device from facility power. This protects the control device from power surges in facility power and prevents transmission of RF noise from the control device onto facility power. It is an object of the present invention to provide a new and improved remote power switch where the control device is electrically isolated from facility power.

The remote power switch may be mounted in the junction box the wall switch or wall outlet it replaces was mounted and may include a receiver for infrared or RF wireless signals as is known in the art. In such circumstances, a remote control is used to communicate with the remote power switch. An aspect of the present invention relates to color-coding of the remote power switch to match the color of the corresponding actuation key on the remote controller. Such color-coding may assist the operator in selecting the proper remote and actuation key for the desired action.

BRIEF DESCRIPTION OF THE DRAWINGS

These and other objects and features of the invention will become readily apparent to those skilled in the art upon reading the description of the exemplary embodiments, in conjunction with the accompanying drawings, in which.

DETAILED DESCRIPTION OF THE PREFERRED EMBODIMENT

Figure 1:
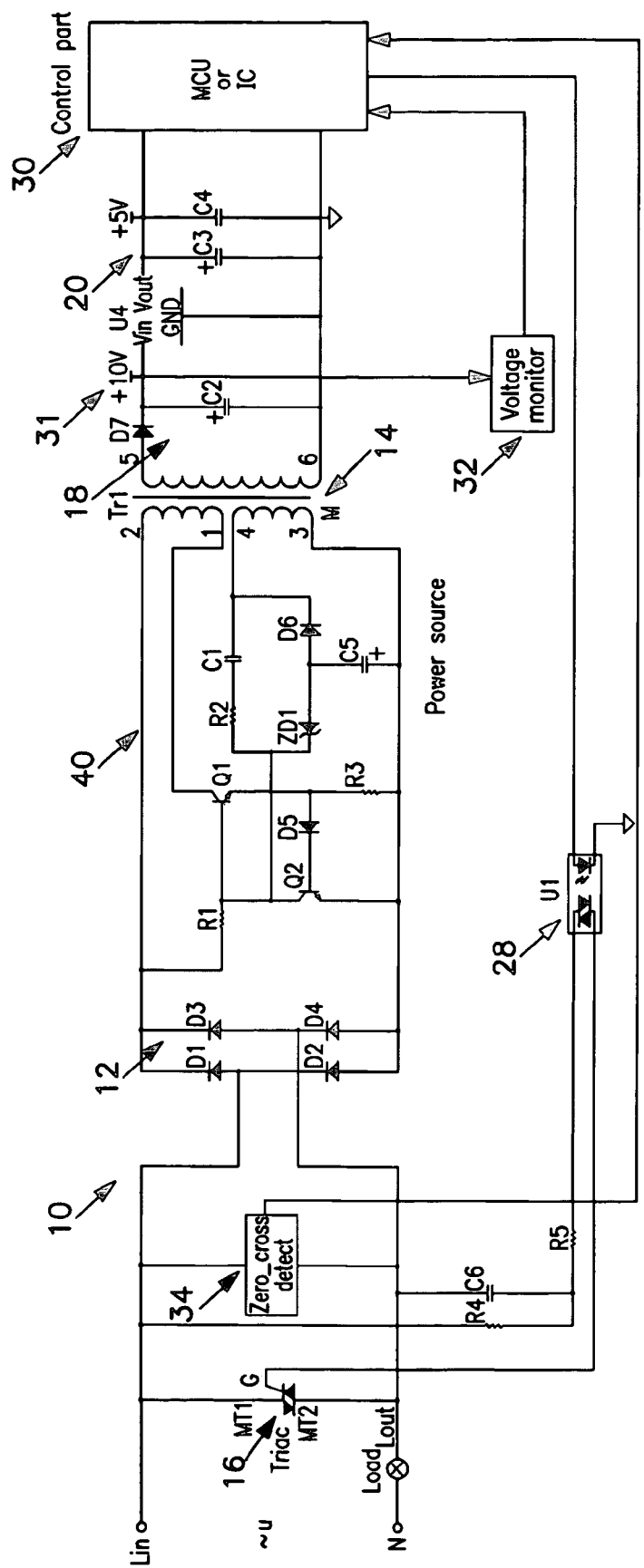
FIG. 1 is a schematic of a representative remote power switch according to aspects of the present invention.

FIG. 1 is a schematic of a representative remote power switch 10 according to aspects of the present invention. The remote power switch 10 includes an electrically actuated power delivery device 16 responsive to a signal to deliver facility power to a load. The load may be computer or communications equipment such as a server, lighting or some other appliance. The power delivery device 16 is connected to interrupt one leg of the facility power connection to the load. The remote power switch 10 includes a control part 30 that generates the power signal for actuating the power delivery device 16. Particular aspects of the present invention relate to an approach to tapping facility power to supply electrical energy to the control part 30 of the remote power switch 10.

The remote power switch 10 is configured to replace conventional switches or outlets. A remote power switch will typically be installed in the junction box that housed the switch or outlet being replaced. The junction box will typically have limited volume and limited ability to dissipate heat. The electrical connections delivered to the junction box will typically be facility power in the form of alternating current (AC). To be a direct replacement for the conventional switch, a remote power switch must include some means for providing operating current to the control part of the switch. Several prior art approaches, including the use of batteries and passive power supplies connected to facility power are discussed above. Batteries are impractical because of their size and need for regular maintenance. Passive power supplies tend to waste power and generate heat that is difficult to dissipate in the closed junction box.

A further complicating factor is that many switch boxes are provided with a single line in and a controlled line out and have no access to the neutral side of the two leg standard AC power system. When the relevant switch is off, power is easily obtained because a large differential is presented across the open switch between the line in and controlled line out. When the switch is closed, this differential is removed and many prior art arrangements cannot reliably obtain power for the electronic switch. Aspects of the present invention relate to a power supply that reliably stores power for triggering the electronic switch when the switch is closed.

The invention is discussed in the context of a remote power switch, but the invention is applicable to any electrically actuated switch requiring a power supply. A remotely actuated power switch is one example. Other examples are a manually actuated electronic switch, an electronic switch actuated by a motion detector, an electronic switch actuated by a timer, etc. The invention is not intended to be limited to the context in which it is illustrated and explained.

The control part 30 of a remote power switch is typically a microcontroller or an integrated circuit responsive to signals from a remote location. The signals may be delivered to the control part by a hardwired connection, radio frequency (RF) connection or infrared (IR) signal. The remote power switch 10 includes means for providing operating voltage, which will typically be in the form of low voltage direct current (DC), to the control part 30. According to aspects of the present invention, the remote power switch 10 employs a combination of electrical circuits 40, 20 to convert a small amount of facility power to a stable DC current for use by the control device. This is accomplished by using active solid state switching components in a pulse-generating circuit arranged to generate pulses of electrical energy from each cycle of AC power. A bridge rectifier 12 is used to rectify the sinusoidal alternating current (AC). FIG. 1 illustrates a transistor oscillator circuit 40 arranged to apply pulses of electrical energy created from the rectified alternating current (AC) to a coil of a transformer 14. Feedback from another coil of the transformer controls oscillation of the transistor. The feedback is used to control switching of the transistor Q1 and thus the energy content of the pulses. Ideally, the energy in the pulses approximates the energy required by the control part 30. An aspect of the present invention relates to matching the power generated by the pulse generating circuit 40 to the power requirements of the control part to maximize efficiency and minimize heat from the dissipation of excess power.

The transformer 14 magnetically couples the energy pulses from the pulse-generating circuit 40 to a power supply circuit 20. A diode/capacitor combination 18 rectifies and filters the pulses of energy from the transformer's secondary coil. In the illustrated embodiment of FIG. 1, this rectified electrical energy is approximately 10 volts DC. This 10 volt DC signal is fed to a 5 volt power supply which further stabilizes and conditions the DC power. Two more capacitors provide additional filtering so that clean 5 volt DC is fed to the control device 30.

An aspect of the present invention relates to solving the problem of generating power for the electronic switch when the electronic switch is on and there is no useful voltage differential between the line in and line out wires. The power supply employs the first portion of each positive and negative half wave of the sinusoidal AC signal to generate and store power for the control part 30. A zero cross detector 34 feeds a signal corresponding to a zero cross of the sinusoidal AC signal to the control part 30, which removes the trigger signal from the triac 16. The triac naturally turns off at the zero cross in the absence of a trigger signal. As the sinusoidal AC signal begins to move positively or negatively away from the zero cross, the power supply uses this initial part of the AC half wave to generate power that is stored in capacitor C3. When the voltage monitor 32 detects a predetermined voltage at node 31, the triggering signal is sent to the triac 16. For the remainder of each AC half wave, the control part uses power stored in capacitor C3 to maintain the trigger signal to the triac 16. At the next zero cross, the process begins again. The control part 30 is programmed to delay power actuation of the triac for a very short time after a zero cross. Such a delay allows sufficient energy to accumulate in capacitor C3 of the power supply to adequately power the control device part 30 for the remainder of each half wave. Capacitor C3 stores electrical energy for use by the control part 30 when the triac 16 is on and there is no useful voltage differential between the line in and line out connections.

Figure 6:
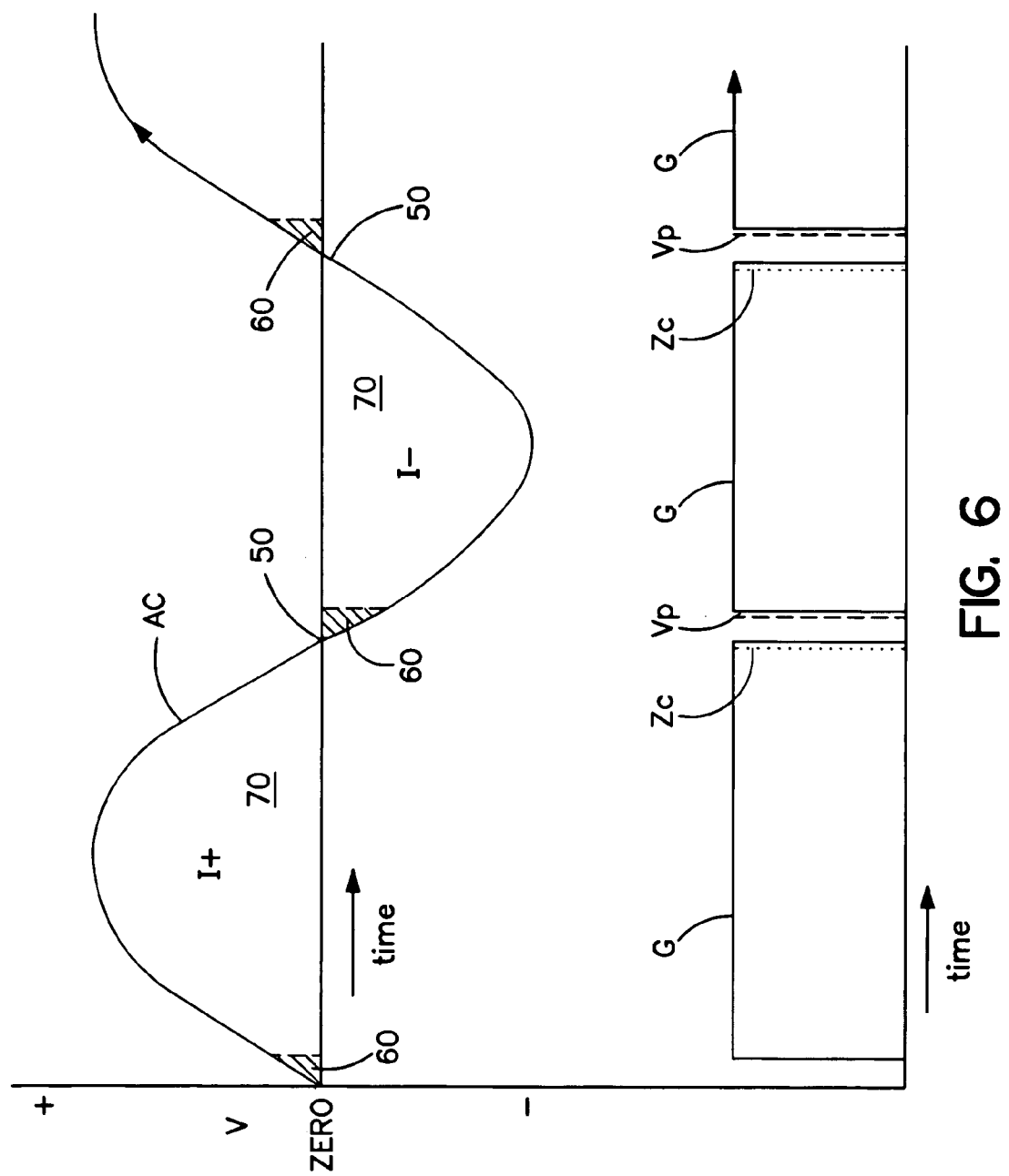
FIG. 6 is a graphical representation of alternating current (AC), the gate signal, the zero cross trigger signal and the voltage present trigger signal with respect to a common time base.

The relationships between the trigger signals used by the control device 30 to remove and restore the gate signal G to the triac 16 are illustrated in FIG. 6. FIG. 6 shows the alternating current (AC) electrical power, zero cross trigger $Z_C$, gate signal G, and voltage present trigger $V_P$ with respect to a common time base when the electronic switch is "on" and power is delivered from the line-in to the line-out. The alternating current (AC) is an alternating sequence of positive and negative going current pulses I+, I− separated by regularly spaced zero crossings 50. The power supply 40 of the electronic switch 10 is configured to use a small initial portion 60 of each current pulse I+, I− to charge capacitor C3. The remainder 70 of each current pulse I+, I− is delivered through the triac 16 to the line-out and the load.

The control device 30 responds to the zero cross trigger Zc by removing the gate signal G from the triac 16. At the zero cross 50, the triac 16 turns off in the absence of the gate signal G. This permits a voltage differential between the line-in and line-out that would not exist if the triac 16 conducted throughout the AC cycle as would be the case in the presence of a continuous gate signal. Since the control part 30 needs little power, the necessary power can be accumulated in capacitor C3 in a very short time using only the initial part 60 of each current pulse I+, I−. The control device removes the gate signal G at the zero cross trigger $Z_C$ and restores the gate signal G when a predetermined voltage is detected at node 31 in the power supply and generates the voltage present trigger $V_P$. In this manner, the bulk of the AC power is delivered through the triac 16 to the load, while the control device 30 is provided with power that would be unavailable from a continuously "on" triac.

When the triac is "off", there is a large voltage differential between the line-in and the line-out. The power supply 40 self-regulates to tap only the power that is needed for the control part from this voltage differential. Transistors Q1 and Q2 oscillate at approximately 30 kHz to apply pulses of electrical current to coil 1, 2 of transformer 14.

A further aspect of the present invention relates to isolating the remote power switch from facility power and the load. For this purpose, the illustrated remote power switch 10 includes an opto-isolator 28 between the power delivery device 16 and the control part 30 to electrically isolate the control part 30 from the power delivery device 16. The control device 16 is electrically isolated from facility power by the magnetic coupling of the pulse-generating circuit 40 to the power supply circuit 20. In combination, the optical and magnetic coupling effectively isolate the remote power switch 10 from facility power and the load. Such an arrangement protects the remote power switch 10 from spikes or surges in facility power and helps prevent feedback from the remote power switch into the facility power.

The inventive remote power switch 10 dramatically increases the efficiency by employing an active solid-state circuit to convert small quantities of facility power to stable direct current for use by the control part. The remote power switch 10 may use voltage monitoring or zero cross detection to ensure no action is taken by the control part 30 until sufficient power is present. The remote power switch 10 electrically isolates the control part 30 from facility power and load.

Figure 2:
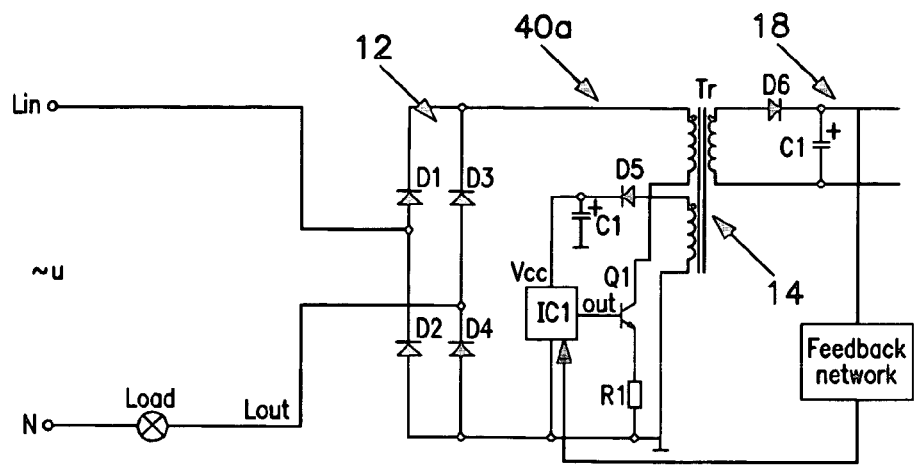
FIG. 2 is a schematic of an alternative pulse-generating and feedback circuit appropriate for use in conjunction with the remote power switch of FIG. 1.
Figure 3:
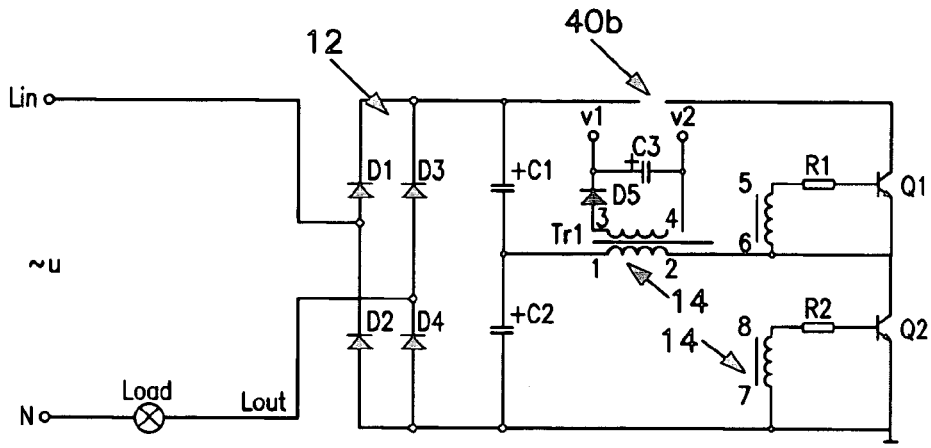
FIG. 3 is a second alternative pulse-generating and feedback circuit appropriate for use in conjunction with the remote power switch of FIG. 1.
Figure 4:
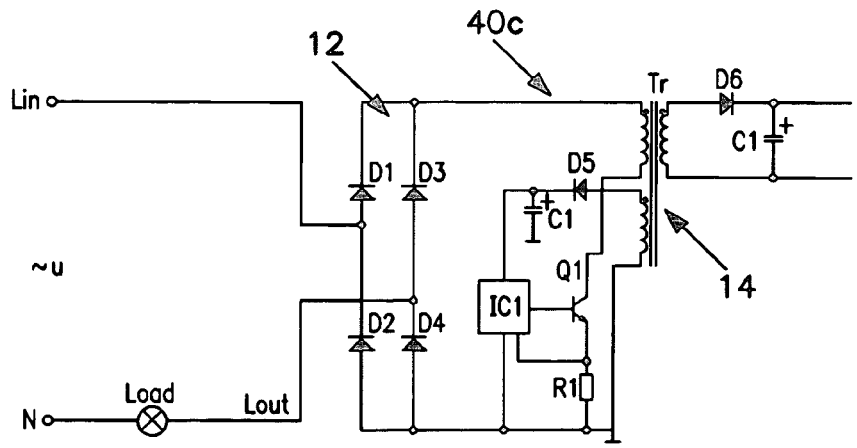
FIG. 4 is a third alternative pulse-generating and feedback circuit appropriate for use in conjunction with the remote power switch of FIG. 1.

FIGS. 2 and 4 illustrate alternative pulse-generating circuits 40a and 40c. Each of the alternative pulse-generating circuits uses a transistor Q1 to apply pulses of electrical energy in the coil of the transformer 14. Feedback from the transformer 14 is used to control switching of the transistor Q1. A diode and capacitor 18 are connected to rectify and filter energy pulses generated in the secondary coil of the transformer 14. This rectified filtered electrical energy is fed to an integrated circuit to further stabilize the power as shown in FIG. 1. FIG. 3 illustrates a further alternative pulse generating pulse-generating circuit 40b. Q1, Q2, C1, C2 and transformer 14 form a double-triode push-pull oscillator. These pulse-generating circuits 40a, 40b, 40c and any alternatives that occur to one of skill in the art are intended to be encompassed by the scope of the present invention.

Figure 5:
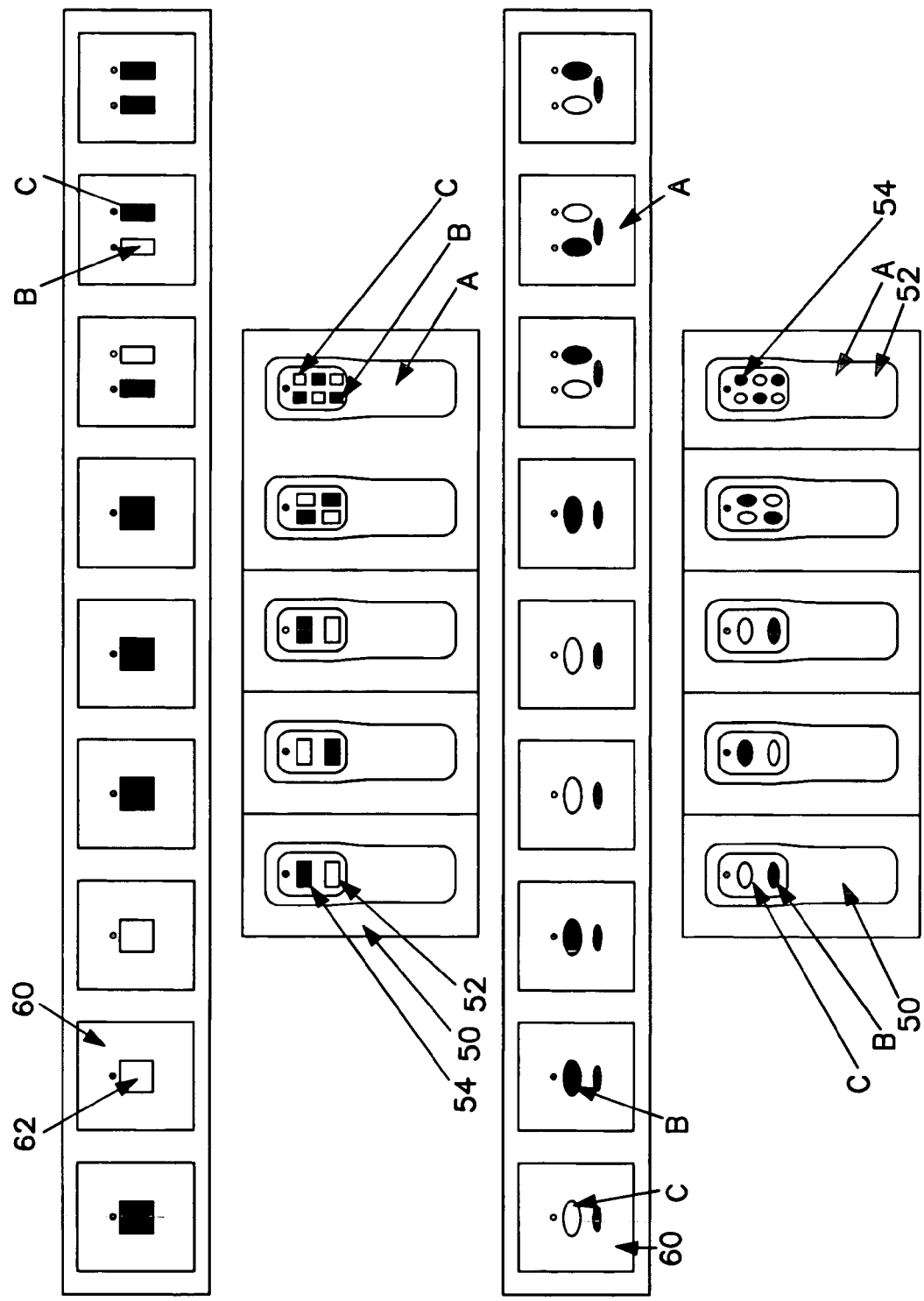
FIG. 5 illustrates the exterior appearance of representative remote power switches and remote controllers according to a color-coding aspect of the present invention.

A further aspect of the present invention relates to color-coding the exterior surfaces 60, 62 of remote power switches and their associated remote controllers 50 as illustrated in FIG. 5. The exterior surface of an installed remote power switch may include a trim plate 60 and a switch cover 62. The remote controller 50 will have a case 52 and actuator keys 54. An aspect of the present invention relates to matching the color of trim plates 60 with the color of an associated remote controller case 52 to assist an operator in selecting the proper remote controller 50. A further aspect of the present invention relates to matching the color of particular switch covers 62 with the color of an associated actuation key to assist an operator in selecting the proper actuation key for a particular action. For example, two remote power switches may be installed to control lighting in a particular room. The trim plate 60 for the installed switches has a trim plate color A and the switch covers 62 are provided with colors B and C. The correct remote controller 50 will have a case color A matching the trim plate 60 of the associated remote switches. The actuation keys are colored B and C, respectively, to match the colors of the associated switch covers 62.

While exemplary embodiments have been described for purposes of illustration, the foregoing descriptions should not be deemed a limitation of the invention herein. Accordingly, various modifications, adaptations and alternatives may occur to one skilled in the art without departing from the spirit and the scope of the present invention.

What is claimed is:

1. An electronic power switch for connecting a line-in to a line-out comprising:
 a source of alternating current (AC) electrical power applied to the line-in, said alternating current including regularly spaced zero crossings between positive and negative going current pulses;
 an electrically actuated power delivery device responsive to the presence of a gate signal to electrically connect the line-in to the line-out to deliver said alternating current to a load and in the absence of said gate signal to disconnect said line-in and line-out at the next zero crossing of said alternating current;
 a power supply connected between said line-in and line-out to convert a portion of each positive and negative going current pulse to direct current (DC);
 a capacitor arranged to store said direct current (DC);
 a control device connected to receive direct current (DC) from said power supply and said capacitor, said control device responsive to an input to generate said gate signal and arranged to detect a predetermined voltage at a node in said power supply; and
 a zero cross detector for detecting each zero cross of the alternating current (AC) and delivering a zero cross signal to said control device,
 wherein said control device is responsive to said zero cross signal to remove said gate signal from said power delivery device, said power delivery device disconnecting said line-in from said line-out in the absence of said gate signal, and said power supply using an initial portion of each positive and negative going current pulse to charge said capacitor, said control device generating said gate signal upon detection of said predetermined voltage, said capacitor delivering direct current to said control device for the remainder of each current pulse.

2. The electronic power switch of claim 1, wherein said power supply comprises:
 a pulse generator connected to said source of alternating current electrical power to divide a portion of said alternating current electrical power into first pulses of electrical energy;
 a transformer having a primary coil and a secondary coil, said pulse generator connected to deliver said first pulses to said primary coil, said first pulses inducing second pulses of electrical energy in said secondary coil;
 a circuit connected to receive said second pulses and convert said second pulses to direct current (DC).

3. The electronic power switch of claim 2, wherein said pulse generator comprises a transistor oscillator circuit.

4. The electronic power switch of claim 3, wherein said transistor oscillator circuit receives a feedback control signal from a coil of said transformer, said feedback control signal employed to control oscillation of said transistor oscillator circuit.

5. The electronic power switch of claim 1, wherein said power delivery device comprises a triac.

6. The electronic power switch of claim 1, wherein said power delivery device is optically coupled to said control device.

7. An electronic power switch having an on state where electrical power is delivered to a load and an off state where electrical power is disconnected from the load comprising:
   an electronic power delivery component responsive to a gate signal to deliver alternating current (AC) electrical power present on a line-in to a line-out, said alternating current (AC) including positive and negative going current pulses separated by regularly spaced zero crossings;
   a control device for generating said gate signal in response to at least one input; and
   a power supply comprising:
   a pulse generating circuit for generating pulses of electrical energy from each current pulse of said alternating current (AC);
   a circuit for generating DC power for said control device, said power supply magnetically coupled to said pulse generating circuit; and
   a power storage component for accumulating said DC power from said circuit and delivering said DC power to said control device over time,
   wherein when said electronic power switch is in the on state, said control device removes said gate signal at each zero cross to allow said power supply to use an initial portion of each current pulse to charge said power storage device and upon detection of a predetermined voltage in said power supply, said control device restores said gate signal whereby a remainder of each current pulse is delivered Through said electronic power delivery component to said line-out.

8. The electronic power switch of claim 7, wherein said pulse generating circuit comprises a transistor oscillator circuit arranged to rectify and divide each said current pulse into said pulses of electrical energy.

9. The electronic power switch of claim 7, wherein said power supply is magnetically coupled to said power supply by a transformer.

10. The electronic power switch of claim 7, wherein said power supply is magnetically coupled to said circuit by a transformer and said pulse generating circuit is responsive to a feedback signal from a coil of said transformer.

11. A method for supplying power to a controller in an electronic power switch including an electronic component responsive to a gate signal to deliver alternating current carried by a line-in to a line-out, said alternating current (AC) including regularly spaced zero crossings between positive and negative going current pulses, said method comprising the steps of:
   configuring said controller to delay actuation of the electronic component after each zero cross so that said electronic power delivery component does not deliver an initial portion of each current pulse to said line-out; and
   using said initial portion of each current pulse to provide power to said controller.

12. The method of claim 11, wherein said step of configuring comprises:
   programming the controller to remove said gate signal in response to a zero cross trigger signal and to restore said gate signal in response to a voltage present trigger signal, said zero cross trigger signal corresponding to each zero cross of the alternating current and the voltage present trigger signal corresponding to a predetermined voltage level in a power supply circuit arranged to provide power to said controller.

13. The method of claim 11, comprising the steps of:
   providing a power supply circuit that uses a voltage differential present between said line-in and said line-out when said gate signal is removed from said electronic component to generate direct current DC power for use by said controller;
   storing said direct current DC in a storage component;
   generating the voltage present trigger signal upon detection of a predetermined voltage in said power supply circuit.

14. The method of claim 11, wherein the step of using comprises storing power generated from the initial portion of each current pulse use by said controller after said gate signal is restored.

* * * * *